(12) United States Patent
Nairn

(10) Patent No.: US 6,900,750 B1
(45) Date of Patent: May 31, 2005

(54) SIGNAL CONDITIONING SYSTEM WITH ADJUSTABLE GAIN AND OFFSET MISMATCHES

(75) Inventor: David G. Nairn, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 3 days.

(21) Appl. No.: 10/826,463

(22) Filed: Apr. 16, 2004

(51) Int. Cl.$^7$ .............................................. H03M 1/06
(52) U.S. Cl. ..................................... 341/118; 341/143
(58) Field of Search ................................ 341/118, 120, 341/122, 143, 155

(56) References Cited

U.S. PATENT DOCUMENTS

| | | | | |
|---|---|---|---|---|
| 5,180,971 A | * | 1/1993 | Montijo ................... | 324/121 R |
| 5,712,633 A | * | 1/1998 | Bae ........................... | 341/120 |
| 6,201,835 B1 | * | 3/2001 | Wang ........................ | 375/247 |
| 6,204,783 B1 | * | 3/2001 | Paz et al. ................... | 341/118 |
| 6,218,973 B1 | * | 4/2001 | Barrett et al. .............. | 341/143 |
| 6,433,723 B1 | * | 8/2002 | Randall ..................... | 341/155 |
| 6,476,990 B1 | * | 11/2002 | Hansen ...................... | 360/32 |
| 6,538,592 B1 | * | 3/2003 | Yang et al. ................. | 341/155 |
| 6,700,516 B1 | * | 3/2004 | MacDonald ................ | 341/122 |

OTHER PUBLICATIONS

Conroy et al, Parallel Pipeline A/D Cohnverter in 1–um CMOS, IEEE Journal of Solid–State Circuits, vol. 28. No. 4, Apr. 1, 1999, p. 447–454.

Fu et al, Digital Background Calibration Technique, IEEE Journal of Solid–State Circuits, vol. 33, No. 12, Dec. 1998, p. 1904–1991.

Dyer et al, Analog Background Calibration Technique, IEEE Journal of Solid–State Circuits, vol. 33, No. 12, Dec. 1998, p. 1912–1919.

Sumanen et al, CMOS Parallel Pipeline A/D Converter, IEEE Journal of Solid–State Circuits, vol. 36, No. 7, Jul. 2001, P1048–1055.

Hummels et al, Distoration Compensation for Time–Interleaved Analog to Digital Converters, IEEE 1996, p. 728–731.

* cited by examiner

*Primary Examiner*—Jean Jeanglaude
*Assistant Examiner*—Linh Van Nguyen
(74) *Attorney, Agent, or Firm*—Koppel, Jacobs, Patrick & Heybl

(57) ABSTRACT

A signal conditioning system includes first and second converters coupled to a random clock which provides a random sampling rate. Corresponding offset sensor coupled with the first and second converters sense and adjust an offset signal difference. A gain sensor is coupled with the first and second converters to sense a gain difference between the first and second converters and a gain corrector is coupled with the gain sensor to adjust the gain difference.

43 Claims, 8 Drawing Sheets

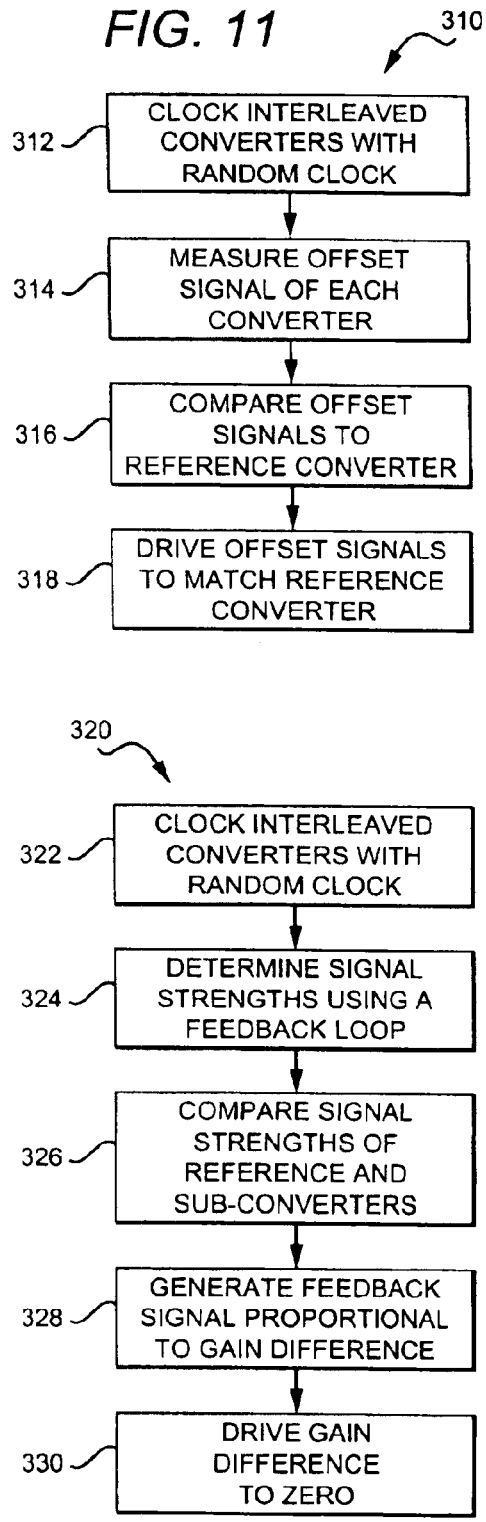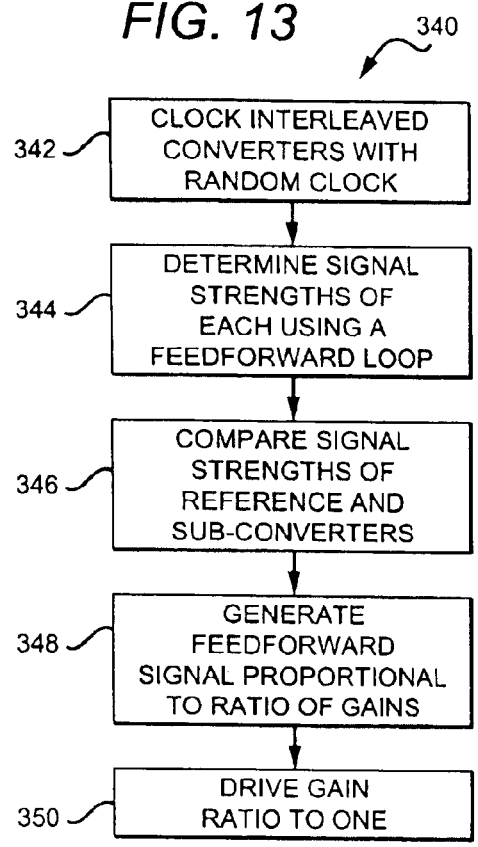
FIG. 11
FIG. 12
FIG. 13

SIGNAL CONDITIONING SYSTEM WITH ADJUSTABLE GAIN AND OFFSET MISMATCHES

BACKGROUND OF THE INVENTION

1. Field of the Invention

This invention relates generally to electronic circuits and, more particularly, to adjusting gain and offset mismatches in signal conditioning systems such as converter circuits.

2. Description of the Related Art

Interleaving is a well-known technique for achieving high sample rates in analog-to-digital converter (ADC) systems. An ADC converts an analog input signal into a digital output signal which represents the analog input signal in digital bits. In a typical implementation, an array of ADCs is arranged to sample the analog input signal in a sequential manner. If each ADC can be clocked at a frequency $f_c$ and if there are M ADCs, then the maximum effective sampling frequency $f_s$ for the interleaved system is $f_s = M \cdot f_c$. It is desirable to increase the sampling frequency so that the analog input signal can be resolved more accurately. The resolution depends on the number of bits in the digital output signal used to represent the analog input signal.

Unfortunately, mismatches between interleaved ADCs can cause significant spurious tones or frequency components at the system's output. These mismatches can be caused by offset and gain mismatches which can affect the Signal-to-Noise and Distortion (SINAD) ratio. A larger SINAD ratio is desirable because it increases the dynamic range of the system so that smaller amplitude analog input signals can be detected accurately in the presence of noise. The dynamic range typically refers to the range of amplitudes between different input signals which can be reliably detected.

Several techniques have been used to reduce mismatches in interleaved ADCs. One technique is to cancel or compensate for the mismatch using an auxiliary input stage or capacitors. Examples of these techniques can be found in D. M. Hummels, J. J. McDonald and F. H. Irons, "Distortion compensation for time-interleaved analog-to-digital converters," IEEE Instrument and Measurement Technology Conference, pp 728–731, June 1996, or C. S. G. Conroy, D. W. Cline and P. R. Gray, "An 8-b 85-MS/s Parallel Pipeline A/D Converter in 1-μm CMOS," Institute of Electrical and Electronic Engineering Journal of Solid State Circuits, Vol. 28, No. 4, pgs. 447–454, April 1993.

Other techniques use a special calibration routine to determine the mismatch, either at startup or during operation. To determine the mismatch during operation, an estimate of the mismatches can be obtained by adding a calibration signal to the input signal which limits the dynamic range of the input signal. See for example, D. Fu, K. Dyer, S. Lewis and P. Hurst, "A Digital Background Calibration Technique for Time-Interleaved Analog-to-Digital Converters," Journal of Solid State Circuits, pgs. 1904–1911, December 1998, K. Dyer, D. Fu, S. Lewis and P. Hurst, "An Analog Background Calibration Technique for Time-Interleaved Analog-to-Digital Converters," Journal of Solid State Circuits, pgs. 1912–1919, December 1998, and L. Sumanen, M. Waltari and K. Halonen, "A 10-bit 200 MS/s CMOS Parallel Pipeline A/D Converter," Journal of Solid State Circuits, pgs. 1048–1055, July 2001.

Another technique to reduce mismatches is to trim the ADCs during fabrication. However, trimming usually cannot correct for mismatches caused by temperature changes which occur during operation. Consequently, trimming during fabrication may not adequately reduce mismatches which change as a function of time.

Interleaved ADC systems can have offset mismatches or gain mismatches. For ADC offset mismatches, it may only be necessary to correct for the difference in offsets between ADCs. However, most offset correction solutions seek to detect the absolute offset of each ADC and then reduce the offset signal to zero. These solutions estimate the ADC offset signal by averaging the output of each ADC over a sufficiently long period of time because the offset error results in a shift in the average level of each output.

For these solutions to work accurately, however, the ADCs' input signal should have a zero dc component. Since most analog input signals have both ac and dc components, this can be problematic because the offset estimate will include both the dc component and the ADC offset signal. Hence, if the dc component is cancelled then the digital output signal will represent the ac component of the analog input signal without the dc component. Instead, the digital output signal should represent both the ac and dc components of the analog input signal. It should be noted that this simple averaging approach also cancels analog input signals at multiples of $f_c = f_s/M$ which can further decrease the accuracy.

To avoid these problems, chopping techniques are commonly used when non-zero dc components are present in the analog input signal. A problem with using chopping, however, is that the same chopping techniques and circuitry typically do not work sufficiently for both a single ADC system and an interleaved ADC system. It is desired to be able to use the same chopping techniques and circuitry for both the single and interleaved ADC systems to make the design and fabrication of these systems simpler.

For a single ADC system, chopping separates the dc component from the ADC offset signal by first chopping or modulating the analog input signal by a tone or frequency at $f_s/2$ so that the dc component is shifted to $f_c/2$. After chopping, the remaining dc signal at the ADC output will mostly be from the ADC offset signal and not the dc component. Hence, a low-pass filter can be used to filter the output signal to obtain an estimate of the ADC offset signal.

For an interleaved ADC system, the situation is different. In these systems with M ADCs and a sampling rate $f_s$, each sub-ADC's clock rate can be $f_c = f_s/M$. As a result when chopping is applied, input tones at $i \cdot f_s/M$ (i=1, 2, ..., M−1) will be aliased to dc where they will be indistinguishable from the offset component. The dc or average output is not a reliable estimate of the ADC's offset. Thus, a chopping circuit that can be used with a single ADC system may not be adequate for use with an interleaved ADC system. Because of this, the chopping circuitry used for a single ADC system is different than the chopping circuitry used for an interleaved ADC system.

Besides offset mismatches, gain mismatches are commonly found in interleaved ADC systems and can also cause a sequence of tones or frequencies at $(i \cdot f_s/M) + $ or $(i \cdot f_s/M - f_{in}$ (i=1, 2 ... M−1). Gain mismatches typically appear as deviations in the slope of the ADC's transfer function which can limit the ADC's dynamic range and SINAD. The dynamic range and SINAD can be improved by trimming the gain of each channel after fabrication or at some point during operation, but to enable the trim process, a reliable method of estimating the gain of each sub-ADC or the gain mismatch between a reference ADC and a sub-ADC is necessary.

Gain mismatches have typically been estimated in one of three ways, including running a separate calibration cycle, adding a calibration signal to the ADC's input signal, or assuming the input signal has certain characteristics. However, each of these techniques limit the usefulness of the interleaved ADCs to certain applications.

For example, in some interleaved ADC systems, a calibration routine with a known calibration signal such as a sine wave is applied to the ADCs input as disclosed in Hummels et al., then the sub-ADCs' outputs are analyzed in either the time or frequency domain. In the time domain, the relative size of each channel's output signal is determined. In the frequency domain, a Digital Fourier Transform is used to uncover frequencies at $(i \cdot f_s/M) + f_{in}$ or $(i \cdot f_s/M) - f_{in}$ (i=1, 2, . . . , M−1). The result of the time or frequency domain analysis is then used to provide an estimate of the gain mismatch. Unfortunately, in many applications, it is either difficult or inconvenient to provide some dead or unused time in which to run the calibration routine because the calculations can be intensive and time consuming.

To avoid the need for a separate calibration, one can add the calibration signal to the input signal as disclosed in Fu et al. Then, assuming the calibration and analog input signals are uncorrelated, the calibration signal is separated from the analog input signal and an estimate of the gain mismatch can be made as before. Unfortunately, the use of a calibration signal significantly reduces the allowable dynamic range of the analog input signal. The dynamic range is reduced because now the sum of the calibration signal and the analog input signal has to be within the dynamic range of the ADC.

The third approach to estimating the gain mismatch is to make assumptions about the characteristics of the analog input signal. Based on this, the gain mismatch between channels can be estimated. One problem with this approach is that the range of applications in which the approach works is restricted because the analog input signal is restricted to the assumed characteristics. If the analog input signal is outside the assumed dynamic range, then the gain mismatch estimation can be inaccurate.

Consequently, there is a need for a signal conditioning system which can adjust and correct offset and gain mismatches of both a single and interleaved ADC system. Further, there is a need for a signal conditioning system where the offset and gain mismatches can be corrected continuously without interrupting the processing of any incoming signals so that data can be processed with minimal delays.

SUMMARY OF THE INVENTION

The present invention provides a signal conditioning system with a first converter and a random clock. The random clock decorrelates an input signal provided to the first converter from the random clock so that the average output signal of the first converter is proportional to a first offset signal. A first offset sensor is connected to sense the first offset signal, and in response to the sensing, to condition the first converter output.

In another embodiment of a signal conditioning system, an integrated circuit which converts between an analog signal and a corresponding digital code with a system sampling rate $f_s$ includes a plurality of converter circuits clocked by a random clock. One or more converter circuits samples the analog signal at least every $1/f_s$ seconds. An offset sensing circuit senses signal offsets and/or signal offset differentials between the outputs of the converter circuits.

The present invention also provides a signal conditioning system which includes a first converter with a first gain and a second converter with a second gain. The first and second converters are clocked in a random sequence and a gain corrector adjusts a difference between the first and second gains.

In another embodiment of a signal conditioning system, an integrated circuit which converts between an analog signal and a corresponding digital code at a clock rate $f_s$ includes a plurality of converter circuits clocked by a random clock. A gain sensor circuit is coupled to each converter circuit and senses a gain from the corresponding converter circuit. A controller circuit selects the plurality of converter circuits in a random sequence.

One embodiment of a method of adjusting an offset signal in a signal conditioning system includes clocking a first converter with a random clock; sensing a first offset signal of the first converter; and subtracting the first offset signal from one of an input signal and an output signal of the first converter.

Another embodiment of a method of adjusting a gain mismatch in a signal conditioning system includes sensing a first gain of a first converter; sensing a second gain of a second converter, the first and second converters being clocked with a random clock; and adjusting at least one of the first and second gains to adjust the gain mismatch between the first and second converters.

These and other features, aspects, and advantages of the present invention will become better understood with reference to the following drawings, description, and claims.

BRIEF DESCRIPTION OF THE DRAWINGS

FIG. 11 is a simplified block diagram of a method of adjusting an offset signal in which the offset signal is driven to a reference offset signal;

FIG. 12 is a simplified block diagram of a method of adjusting a gain mismatch using a feedback loop; and FIG. 13 is a simplified block diagram of a method of adjusting a gain mismatch using a feedforward loop.

DETAILED DESCRIPTION OF THE INVENTION

FIGS. 1–4 and 6–8 illustrate different embodiments of signal conditioning systems in accordance with the present invention. It should be noted that the signal conditioning systems can include, for example, a differential amplifier, an operational amplifier, an analog-to-digital converter (ADC), or a digital to analog converter among others. In the embodiments shown in the following figures, however, the signal conditioning systems include analog-to-digital converters to exemplify the features of the invention.

Figure 1:
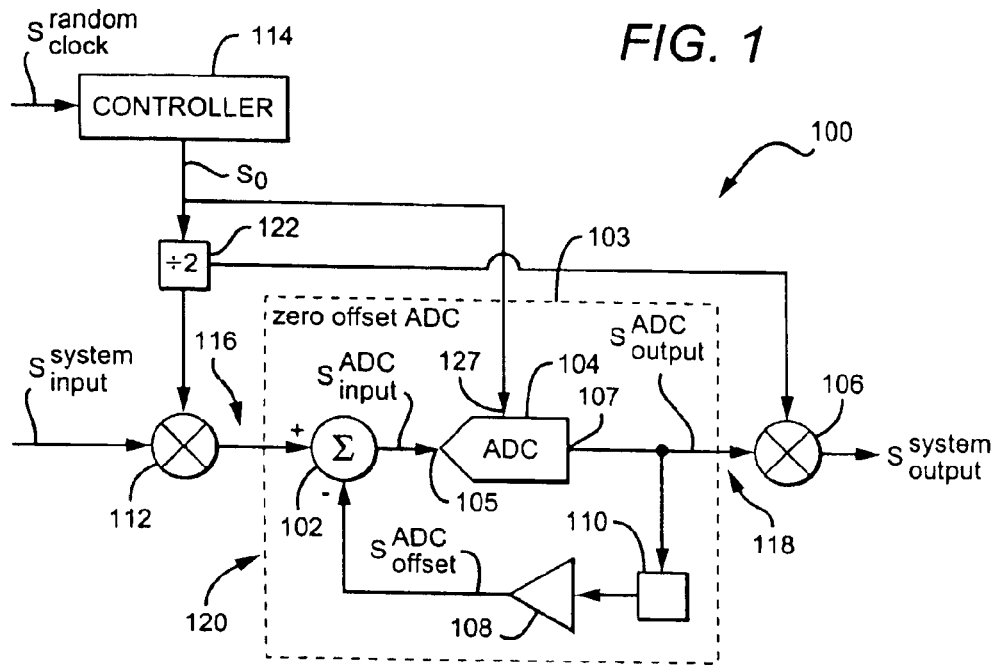
FIG. 1 is a simplified schematic diagram illustrating a signal conditioning system which uses analog techniques to correct an offset signal.

FIG. 1 illustrates a signal conditioning system 100 which uses analog techniques to adjust or correct an offset signal. The term "analog techniques" refers to the coupling of an ADC output to an ADC input through a feedback loop in which where the offset signal is subtracted from an analog input signal to condition a digital output signal. It should be noted, however, that the offset signal is subtracted from the analog input signal for simplicity and ease of discussion. The digital output signal can be conditioned by using other mathematical operations such as addition, multiplication, or division.

Signal conditioning system 100 includes an ADC 104 coupled with a feedback loop 120. Feedback loop 120 includes a filter 110 and a gain scaler 108 which are coupled between an analog adder 102 and an output 107 in which analog adder 102 couples gain scaler 108 to an input 105. It should be noted that gain scaler 108 can amplify or attenuate the signal from filter 110. Gain scaler 108 can include a buffer in which the signal from filter 110 is outputted by scaler 108 to adder 102 (i.e. the signal is scaled by a factor of one). The buffer can prevent the input signal from flowing through loop 120 to output 107.

Filter 110 can include a low pass filter or another filter to attenuate undesired frequencies in feedback loop 120. Adder 102, ADC 104, gain scaler 108, and filter 110 form a zero offset ADC 103 with an input port 116 and an output port 118 in which port 116 is coupled to input 105 through adder 102 and port 118 is connected to output 107.

A controller 114 is coupled to ADC 104 at an ADC select or enable terminal 127 in which controller 114 provides a random select or clock signal denoted as $S_0$. Controller 114 is coupled to a modulator 112 and a demodulator 106 through a divider 122 in which modulator 112 is coupled to input port 116 and demodulator 106 is coupled to output port 118.

Controller 114 provides random select or clock signal $S_0$ in response to a random clock signal $S_{Clock}^{Random}$ which has a random frequency $f_c$. Controller 114 can receive random clock signal $S_{Clock}^{Random}$ from an external system or it can generate $S_{Clock}^{Random}$ internally. The term "random clock signal" is used here and throughout the disclosure to define clock signals where a previous portion of the clock signal is not used to determine a future portion of the clock signal. The random clock signals can be provided by a random clock generator, a pseudorandom clock generator, or an aperiodic clock generator.

In operation, modulator 112 receives a system input signal $S_{input}^{system}$ which generally includes a system offset signal $S_{offset}^{system}$. Modulator 112 and controller 114 behave as a sampling circuit which provides random samples of $S_{input}^{system}$ to input port 116 in successive $1/f_s$ system periods in which $f_s = M \cdot f_c$ (i.e. M=1). Controller 114 also clocks ADC 104 through terminal 127 at a rate equal to $f_c$ so that $S_{input}^{system}$ is decorrelated from $S_{clock}^{random}$. When $S_{input}^{system}$ is decorrelated from $S_{clock}^{random}$ the average of $S_{output}^{ADC}$ is proportional to the offset signal of ADC 104, $S_{offset}^{ADC}$.

Modulator 112 modulates $S_{input}^{system}$ at a frequency equal to $f_c/2$ so that $S_{offset}^{system}$ is shifted to $f_c/2$ and it can be filtered by filter 110. In this way, the remaining signal subtracted from $S_{input}^{system}$ by adder 102 will be equal to $S_{offset}^{ADC}$ as desired. Demodulator 106 demodulates or unchops $S_{output}^{ADC}$ at output 107 to restore signal $S_{output}^{ADC}$ back to base band to provide a system output signal $S_{output}^{system}$, which is now corrected for $S_{offset}^{ADC}$.

It should be noted that frequency $f_c$ is divided by a factor of two in this embodiment for simplicity and ease of discussion where the factor can be any number which shifts $S_{offset}^{system}$ to a frequency outside a pass band of filter 110 so that $S_{offset}^{system}$ is not fed back through loop 120. For example, since filter 110 is a low pass filter here, it is generally desirable to shift $S_{offset}^{system}$ to a frequency greater than the filter cut-off frequency.

Hence, feedback loop 120 behaves as an offset signal sensor or detector by sensing an average of ADC output signal $S_{output}^{ADC}$ at output 107. The average of $S_{output}^{ADC}$ is then filtered to remove $S_{offset}^{ADC}$ and scaled by gain scaler 108. The resulting analog signal, $S_{input}^{system}$ is coupled to analog adder 102 and subtracted from $S_{input}^{system}$ so that $S_{output}^{ADC}$ is corrected for $S_{offset}^{ADC}$ as desired.

Figure 2:
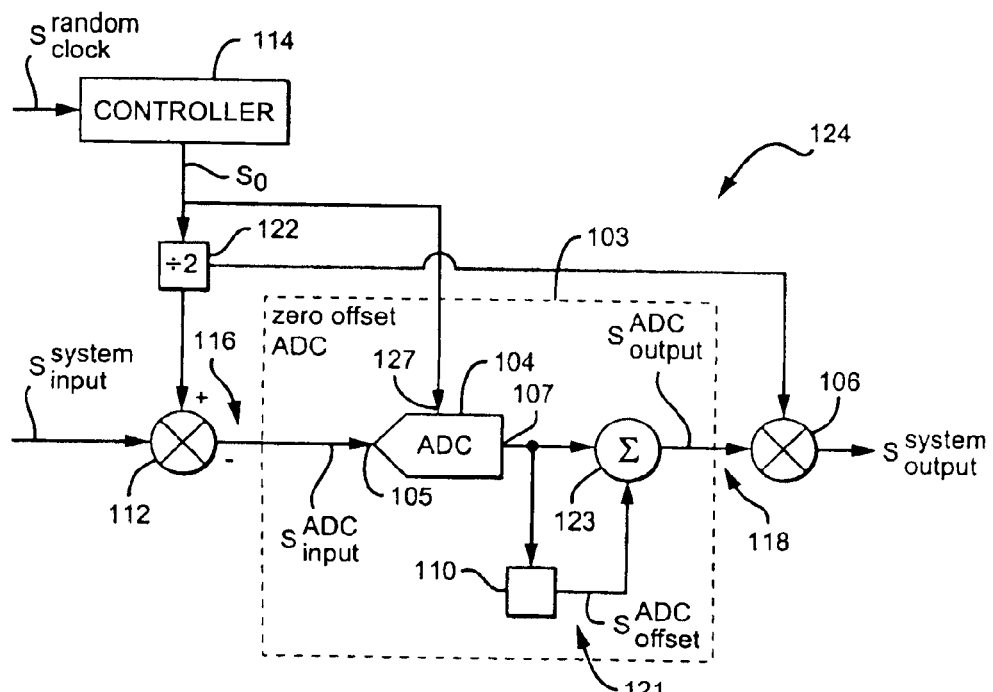
FIG. 2 is a simplified schematic diagram illustrating a signal conditioning system which uses digital techniques to correct an offset signal.

FIG. 2 illustrates a signal conditioning system 124 which uses digital techniques to adjust or correct an offset signal. The term "digital techniques" refers to the coupling of an ADC output to an ADC output port through a feedforward loop in which the offset signal is subtracted from the digital output signal to condition the digital output signal. It should be noted that system 124 includes similar components to the components illustrated in FIG. 1. Hence, similar numbering is used with the understanding that the discussion above in conjunction with system 100 applies equally to system 124.

Signal conditioning system 124 includes ADC 104 with output 107 coupled to a digital adder 123. Feedforward loop 121 is coupled between output 107 and adder 123 and includes filter 110. Adder 123, ADC 104, and filter 110 form zero offset ADC 103 with input port 116 and output port 118. It should be noted that a feedback loop similar to that shown in FIG. 1 can also be used, but a feedforward loop is illustrated for simplicity and ease of discussion.

In operation, modulator 112 and controller 114 behave as a sampling circuit which decorrelate $S_{input}^{system}$ from $S_{clock}^{random}$ so that the average of $S_{output}^{ADC}$ is proportional to $S_{offset}^{ADC}$. Feedforward loop 121 behaves as an offset signal sensor or detector by sensing the average of $S_{output}^{ADC}$ at output 107. The average of $S_{output}^{ADC}$ is then filtered by filter 110 to remove $S_{offset}^{system}$. The resulting signal, $S_{offset}^{ADC}$, is coupled to digital adder 123 and subtracted from $S_{output}^{ADC}$ so that $S_{offset}^{ADC}$ is driven to zero or removed from $S_{output}^{ADC}$ as desired. Demodulator 106 demodulates or unchops $S_{output}^{ADC}$ at output 107 to restore signal $S_{output}^{ADC}$ back to base band to provide a system output signal $S_{output}^{system}$, which is now corrected for $S_{offset}^{ADC}$.

Typical signal conditioning systems include more than one analog to digital converter. For example, a signal conditioning system can include multiple ADCs interleaved to increase a sampling rate $f_s$. One advantage of using interleaved ADCs is that the sampling rate can be increased proportionally to the number of ADCs. For example, if the clock frequency in an interleaved ADC system is $f_c$ and the number of interleaved ADCs is M, then the sampling rate of the system will be equal to $f_s = M \cdot f_c$.

One problem with interleaved signal conditioning systems, however, is that each ADC can have a different offset signal. One way to correct to a zero offset signal is to use a single ADC as a reference offset and then correct the other ADCs to that reference offset. Another way to correct to a zero offset signal is to individually correct each ADC to a zero offset as described above in conjunction with FIGS. 1 and 2.

Figure 3:
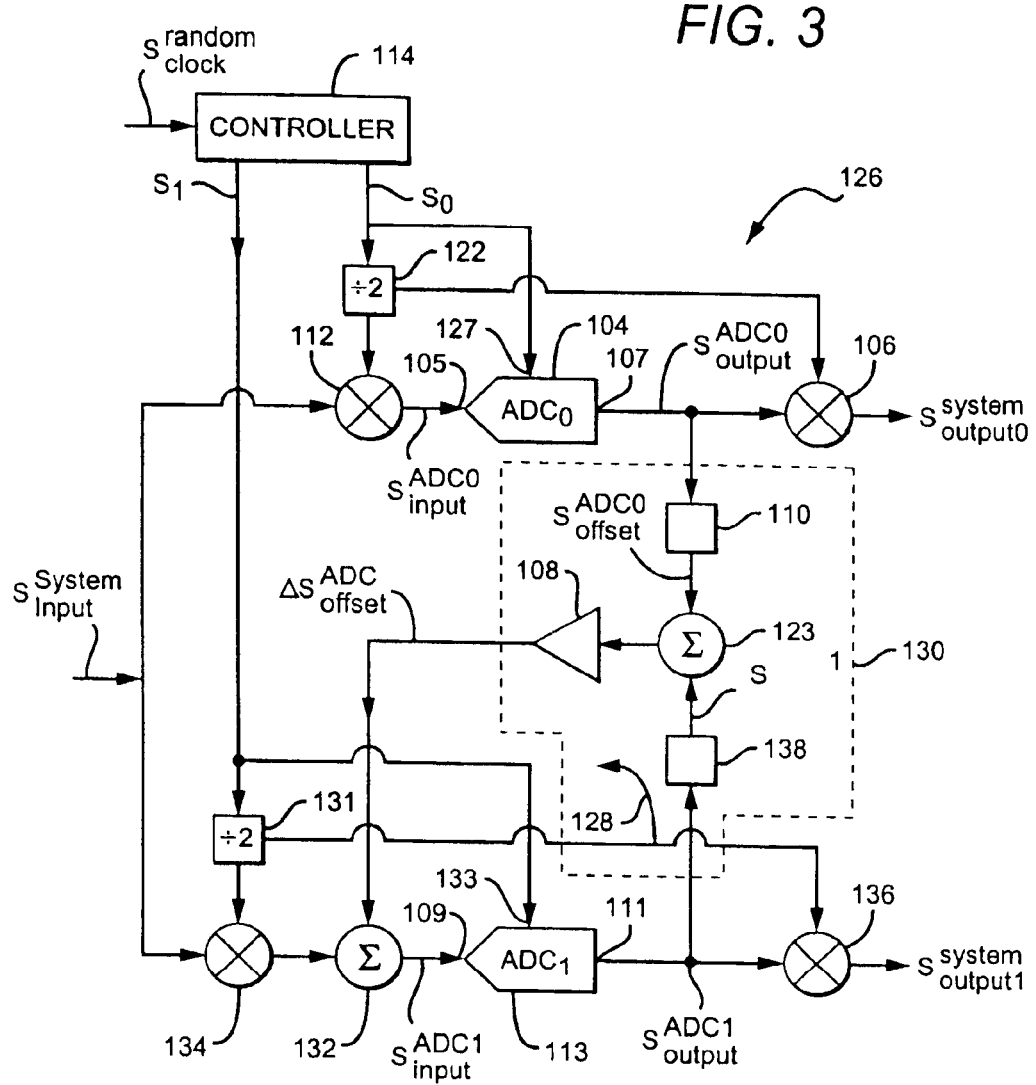
FIG. 3 is a simplified schematic diagram illustrating an interleaved signal conditioning system in which the offset signal of each sub-ADC is corrected to a reference ADC offset signal.

FIG. 3 illustrates a signal conditioning system 126 in which a single ADC is used to provide a reference offset corresponding to a reference ADC. System 126 also senses an offset signal for each additional or sub-ADC included in system 126 then uses analog techniques as illustrated in FIG. 1 to drive each sub-ADCs' offset to the reference offset. It should be noted that system 126 can use digital techniques as illustrated in FIG. 2 or combinations of digital and analog techniques.

Signal conditioning system 126 includes reference ADC 104 with input port 105 coupled to modulator 112 and output port 107 coupled to demodulator 106. Digital adder 123 is coupled to output port 107 through filter 110. Signal conditioning system 126 also includes an ADC 113 with an input port 109 coupled to an analog adder 132 and an output port 111 coupled to a demodulator 136. Digital adder 123 is coupled to output port 111 through a filter 138. Filter 138 can include a low pass filter or another filter to attenuate undesired frequencies and can be similar to filter 110. Digital adder 123 is coupled between filters 110 and 138 and gain scaler 108 is coupled between digital adder 123 and analog adder 132.

Controller 114 is coupled to ADCs 104 and 113 through terminal 127 and an ADC select terminal 133, respectively. Controller 114 is coupled to modulator 112 and demodulator 106 through divider 122 and to modulator 134 and demodulator 136 through a divider 131 in which modulator 134 is coupled to analog adder 132. Controller 114 provides random select or clock signals $S_0$ and $S_1$ to ADCs 104 and 113, respectively, where signal $S_0$ is provided to ADC select terminal 127 and signal $S_1$ is provided to ADC select terminal 133. Signals $S_0$ and $S_1$ are generated by controller 114 in response to random clock signal $S_{Clock}^{Random}$ to select ADCs 104 and 113 in a random sequence so that signal $S_{input}^{system}$ is sampled randomly.

Filter 138, digital adder 123, and gain scaler 108 form a feedback loop 128. Feedback loop 128 and filter 110 form a corrector or offset sensing circuit 130 which senses and adjusts an offset signal mismatch between ADCs 104 and 113. The offset signal mismatch is proportional to a difference between the offset signals between ADCs 104 and 113, which are denoted as $S_{offset}^{ADC0}$ and $S_{offset}^{ADC1}$, respectively.

In operation, modulators 112 and 134 receive $S_{input}^{system}$. Modulators 112, 134, and controller 114 behave as a sampling circuit which provides random samples of $S_{input}^{system}$ to ADCs 104 and 113. Controller 114 clocks ADCs 104 and 113 at a rate $f_c$ so that $S_{input}^{system}$ is decorrelated from $S_{clock}^{random}$ and the average of $S_{output}^{ADC0}$ and $S_{output}^{ADC1}$ are proportional to the offsets of ADCs 104 and 113, respectively.

Signal $S_{offset}^{system}$ is shifted to $f_c$ by modulators 112 and 134 so that it can be filtered by filters 110 and 138. After $S_{offset}^{system}$ is filtered by filters 110 and 138 from signals $S_{output}^{ADC0}$ and $S_{output}^{ADC1}$, respectively, the remaining offset signal through gain scaler 108 and coupled to adder 132 will be proportional to $\Delta S_{offset}^{ADC} = S_{offset}^{ADC0} - S_{offset}^{ADC1}$. Adder 132 then adds signal $\Delta S_{offset}^{ADC}$ to $S_{input}^{system}$ at input 109 so that $S_{offset}^{ADC1}$ is driven to zero or removed from $S_{input}^{ADC1}$ as desired. Demodulators 106 and 136 then provide respective offset corrected output signals $S_{output0}^{system}$ and $S_{output1}^{system}$.

Hence, feedback loop 128 senses an average of ADC output signal $S_{output}^{ADC1}$ at output 111. The average of $S_{output}^{ADC1}$ is then filtered to remove $S_{offset}^{system}$. The resulting signal, $S_{offset}^{ADC1}$, is coupled to digital adder 123 and subtracted from $S_{offset}^{ADC0}$ so that $S_{offset}^{ADC1}$ is driven to $S_{offset}^{ADC0}$ and the difference between the offsets of ADCs 104 and 113 is driven to zero.

Figure 4:
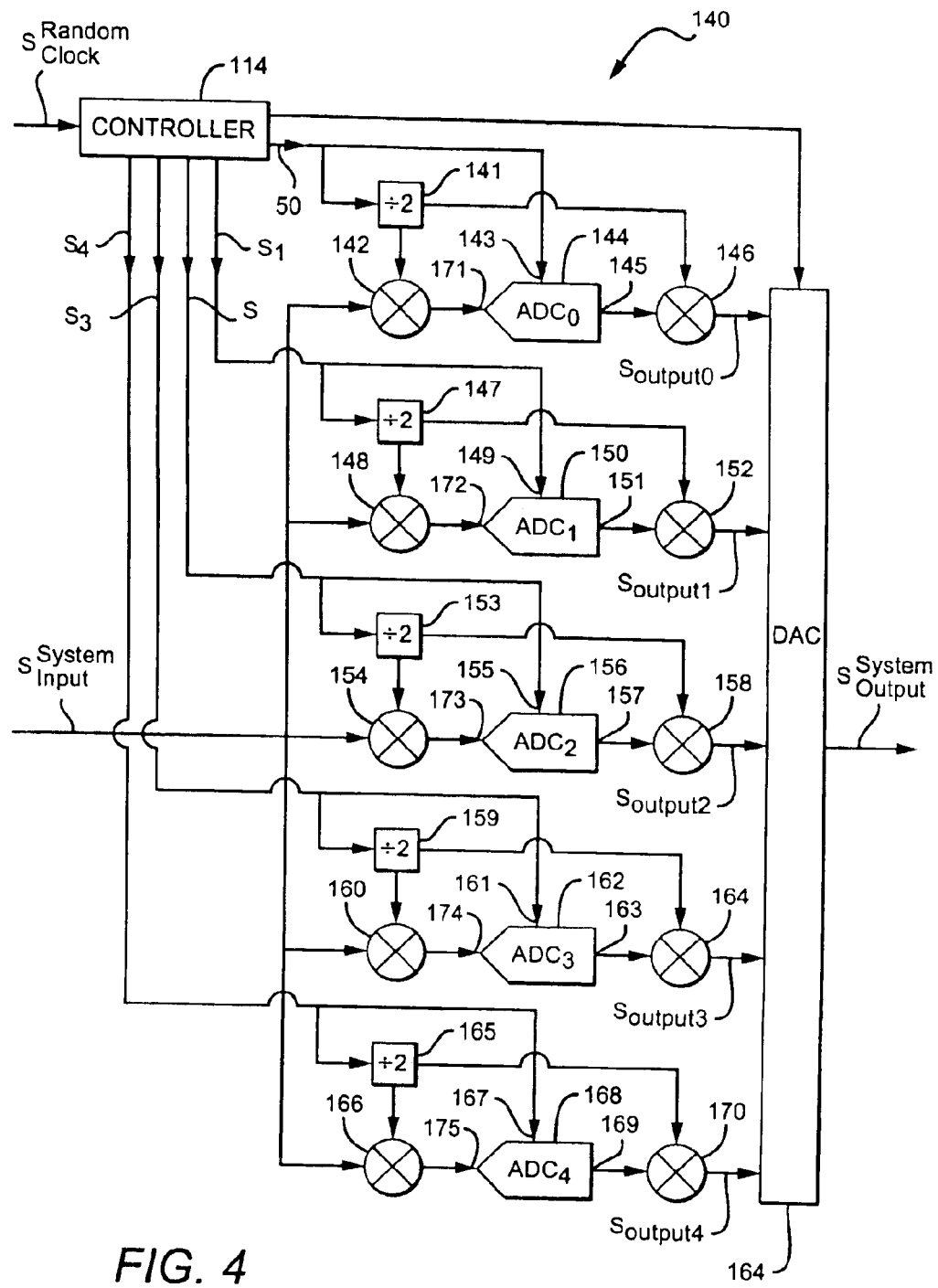
FIG. 4 is a simplified block diagram illustrating an interleaved signal conditioning system in which each individual ADC is offset corrected.

FIG. 4 illustrates a signal conditioning system 140 in which the offset mismatch of the system is corrected by correcting the offset signal of each individual ADC to zero. Each ADC included in signal conditioning system 140 senses a corresponding ADC offset signal and drives the sensed offset signal to zero as illustrated in FIG. 1. However, system 140 can use digital techniques as illustrated in FIG. 2 or combinations of digital and analog techniques.

Signal conditioning system 140 includes interleaved ADCs 144, 150, 156, 162, and 168. A modulator 142 is coupled to an input 171 of ADC 144 and a demodulator 146 is coupled to an output 145 of ADC 144. Controller 114 is connected to modulator 142 and demodulator 146 through a divider 141. Controller 114 is also connected to an ADC select terminal 143 of ADC 144. A modulator 148 is coupled to an input 172 of ADC 150 and a demodulator 152 is coupled to an output 151 of ADC 150. Controller 114 is connected to modulator 148 and demodulator 152 through a divider 147. Controller 114 is also connected to an ADC select terminal 149 of ADC 150. A modulator 154 is coupled to an input 173 of ADC 156 and a demodulator 158 is coupled to an output 157 of ADC 156. Controller 114 is connected to modulator 154 and demodulator 158 through a divider 153. Controller 114 is also connected to an ADC select terminal 155 of ADC 156.

A modulator 160 is coupled to an input 174 of ADC 162 and a demodulator 164 is coupled to an output 163 of ADC 162. Controller 114 is connected to modulator 160 and demodulator 164 through a divider 159. Controller 114 is also connected to an ADC select terminal 161 of ADC 162. A modulator 166 is coupled to an input 175 of ADC 168 and a demodulator 170 is coupled to an output 169 of ADC 168. Controller 114 is connected to modulator 166 and demodulator 170 through a divider 165. Controller 114 is also connected to an ADC select terminal 167 of ADC 168.

Controller 114 provides select or clock signals $S_0$, $S_1$, $S_2$, $S_3$, and $S_4$ to ADCs 144, 150, 156, 162, and 168, respectively, through respective ADC select terminals 143, 149, 155, 161, and 167. Controller 114 also provides signals $S_0$, $S_1$, $S_2$, $S_3$, and $S_4$ to modulators 142, 148, 154, 160, and 166 and demodulators 146, 152, 158, 164, and 170 through respective dividers 141, 147, 153, 159, and 165.

Inputs of modulators 142, 148, 154, 160, and 166 are configured to randomly receive system input signal $S_{input}^{system}$. Demodulators 146, 152, 158, 164, and 170 are configured to provide digital output signals $S_{output0}$, $S_{output1}$, $S_{output2}$, $S_{output3}$, and $S_{output4}$, respectively, which correspond to digitized portions of signal $S_{input}^{system}$. Outputs of demodulators 146, 152, 158, 164, and 170 are connected to a digital-to-analog converter 164 which is configured to provide system output signal $S_{output}^{system}$ which corresponds to signal $S_{input}^{system}$.

The outputs of demodulators 146, 152, 158, 164, and 170 can be connected to other signal conditioning systems such as a multiplexer or a communication channel. However, the outputs of demodulators 146, 152, 158, 164, and 170 are connected to DAC 164 for simplicity and ease of discussion and to better illustrate the inventive features of system 140.

Each of ADCs 144, 150, 156, 162, and 168 can correspond to zero offset ADC 103 illustrated in FIG. 1. Further, five ADCs are illustrated in system 140 for simplicity and ease of discussion, but system 140 generally includes two or more. For example, system 140 with one ADC corresponds with system 100 or system 124 illustrated in FIGS. 1 and 2, respectively.

In operation, signal $S_{input}^{system}$ is coupled to inputs of modulators 142, 148, 154, 160, and 166. Controller 114 is configured to randomly select one of modulators 142, 148, 154, 160, and 166 to sample input signal $S_{input}^{system}$ by sending signals $S_0$, $S_1$, $S_2$, $S_3$, and $S_4$ to respective ADCs. The random clock signals modulate each ADC in system 140 as discussed above in conjunction with FIG. 1 to decorrelate $S_{input}^{system}$ from $S_{clock}^{random}$. Controller 114 is also configured to detect instances when an ADC in system 140 is available to process an upcoming one of the random samples.

Figure 5A:
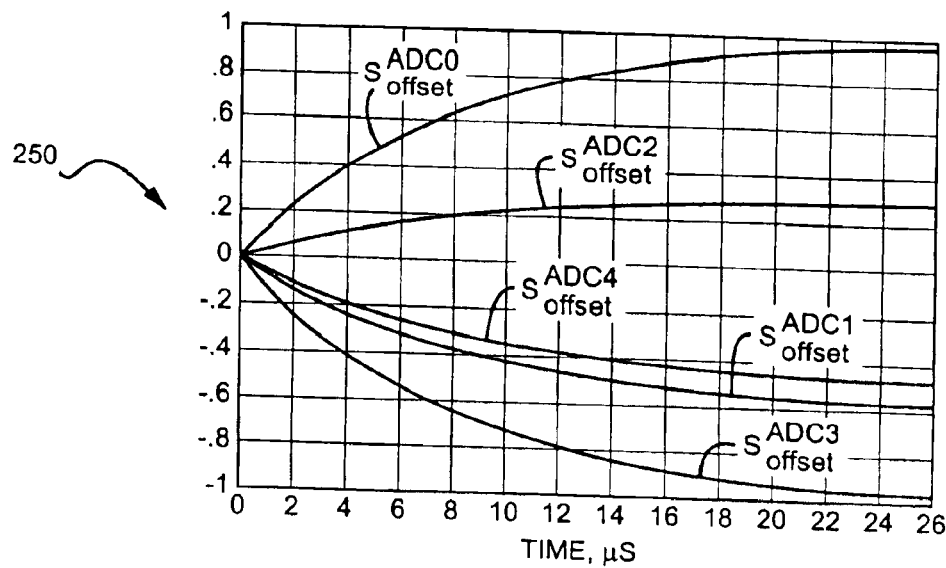
FIGS. 5a and 5b are graphs illustrating the offset correction for the interleaved signal conditioning system illustrated in FIG. 4.
Figure 5B:
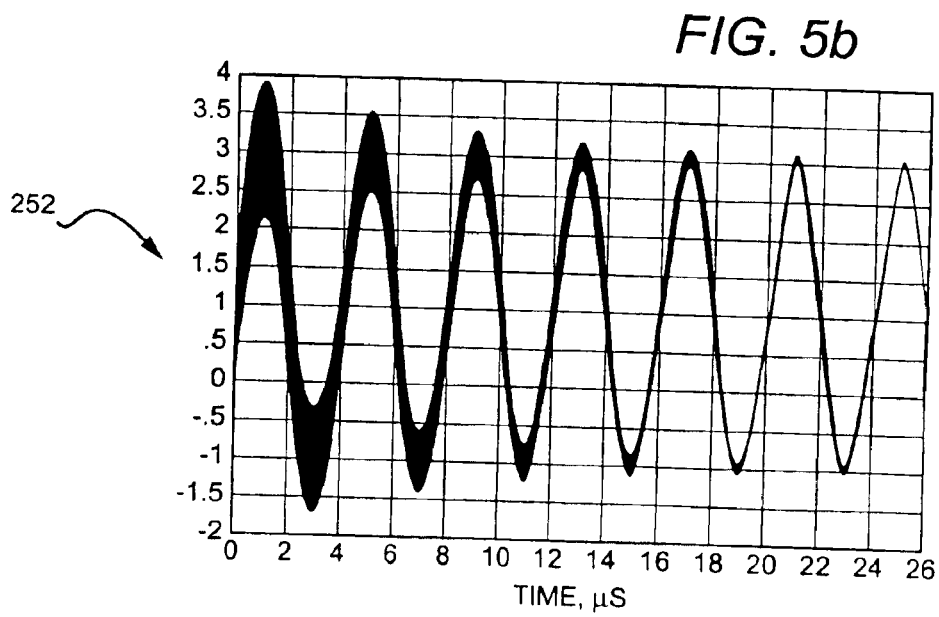

FIG. 5a illustrates a graph 250 of the offset correction signals as a function of time for the ADCs included in signal conditioning system 140 and FIG. 5b illustrates a graph 252 of output signal $S_{output}^{system}$ of system 140 as a function of time. The output signal shown in FIG. 5b corresponds to analog signal $S_{input}^{system}$ after $S_{input}^{system}$ has been inputted into system 140, converted to a digital signal corresponding to signals $S_{output0}$, $S_{output1}$, $S_{output2}$, $S_{output3}$, and $S_{output4}$, and then converted back into an analog signal $S_{output}^{system}$ by DAC 164.

In graph 250, ADCs 144, 150, 156, 162, and 168 have offset signals of $S_{offset}^{ADC0}$=−1.0 volt, $S_{offset}^{ADC1}$=0.6 volts, $S_{offset}^{ADC2}$=0.3 volts, $S_{offset}^{ADC3}$=1.0 volts, and $S_{offset}^{ADC4}$=0.5 volt, respectively, as indicated in Table 1. However, the values for the offset signals are chosen to show how the offsets are corrected by system 140.

At a time equal to zero, the offset correction signals are initially zero for illustrative purposes. At a time around 26 µS, the offset correction signals converge to the negative of the offset signal as described in conjunction with FIG. 1 so that the corresponding signals cancel when added together as indicated in Table 1. In FIG. 5b at time equal to zero, the distortion of signal $S_{output}^{system}$ is a maximum because the offset signals are not being corrected. At a later time, the distortion of signal $S_{output}^{system}$ decreases so that at time equal to about 26 µS, the distortion is smaller. The distortion decreases with time as the offset correction signals cancel out the corresponding offset signals so that analog signal $S_{output}^{system}$ approximates $S_{input}^{system}$.

TABLE 1

Offset correction for system 140.

| ADC | Signal | ADC Offset | Signal Correction Time = 0 µS | Signal Correction Time = 26 µS | Corrected Offset |
|---|---|---|---|---|---|
| 144 | $S_{offset}^{ADC0}$ | −1.0 | 0.0 | 1.0 | 0.0 |
| 148 | $S_{offset}^{ADC1}$ | 0.6 | 0.0 | −0.6 | 0.0 |
| 152 | $S_{offset}^{ADC2}$ | −0.3 | 0.0 | 0.3 | 0.0 |

TABLE 1-continued

Offset correction for system 140.

| ADC | Signal | ADC Offset | Signal Correction Time = 0 µS | Signal Correction Time = 26 µS | Corrected Offset |
|---|---|---|---|---|---|
| 156 | $S_{offset}^{ADC3}$ | 1.0 | 0.0 | −1.0 | 0.0 |
| 160 | $S_{offset}^{ADC4}$ | 0.5 | 0.0 | −0.5 | 0.0 |

Figure 6:
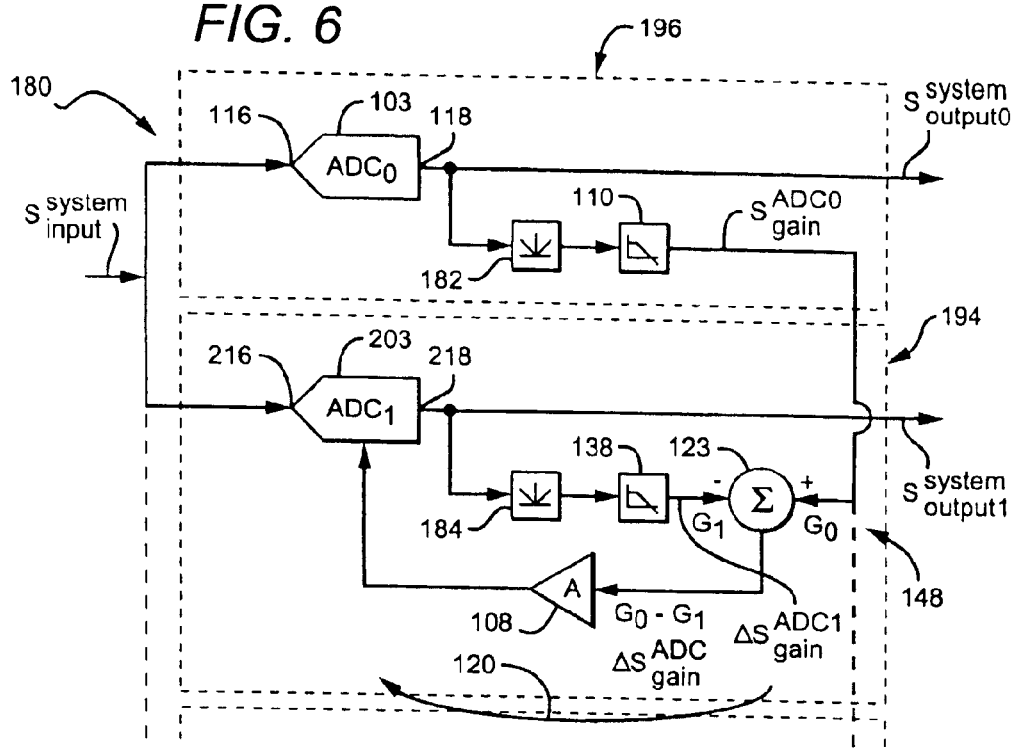
FIG. 6 is a simplified schematic diagram illustrating an interleaved signal conditioning system with a corrected gain mismatch using analog techniques.

FIG. 6 illustrates a signal conditioning system 180 where a gain mismatch is corrected using analog techniques. Signal conditioning system 180 senses and corrects a gain mismatch between interleaved ADCs. Signal conditioning system 180 includes a zero offset ADC 103 with output 118 coupled to digital adder 123 through a rectifier 182 and filter 110 which provide a gain signal $S_{gain}^{ADC0}$. A zero offset ADC 203 with an output 218 is coupled to digital adder 123 through a rectifier 184 and filter 138 which provide a gain signal $S_{gain}^{ADC1}$.

Zero offset ADC 203 can be similar to zero offset ADC 103. Zero offset ADCs 103 and 203 are included in this embodiment because the gain correction is more accurate if the offset signal between ADCs 103 and 203 has been corrected first. However, ADCs 103 and 203 can have offset signal mismatches in which the gain correction will generally be less accurate.

Gain scaler 108 is coupled between digital adder 123 and zero offset ADC 203. Rectifier 184, filter 138, digital adder 123, and gain scaler 108 form feedback loop 120 coupled between output 218 and zero offset ADC 203. ADC 103, rectifier 182, and filter 110 form a reference ADC 196 and ADC 203, rectifier 184, filter 138, adder 123, and gain scaler 108 form a gain corrected ADC 194. Feedback loop 120 with rectifier 184 and filter 138 behave as a gain corrector 148 to provide a signal $\Delta S_{gain}^{ADC}$ proportional to a difference gain between the gains of ADCs 103 and 203 (i.e. $\Delta S_{gain}^{ADC} = S_{gain}^{ADC0} - S_{gain}^{ADC1}$).

In operation, zero offset ADC 103 receives a system input signal $S_{input}^{system}$ at input 116, where $S_{input}^{system}$ is converted to output signal $S_{output0}^{system}$ at output 118. Gain signal $S_{gain}^{ADC0}$ is sensed by rectifying and filtering $S_{output0}^{system}$ through rectifier 182 and filter 110, respectively, where $S_{gain}^{ADC0}$ is coupled to digital adder 123.

Similarly, zero offset ADC 203 receives $S_{input}^{system}$ at an input 216 and converts $S_{input}^{system}$ to an output signal $S_{output1}^{system}$ at output 218. Gain signal $S_{gain}^{ADC1}$ is sensed by rectifying and filtering $S_{output1}^{system}$ through rectifier 184 and filter 138, respectively, where signal $S_{gain}^{ADC1}$ is coupled to digital adder 123. Digital adder 123 provides signal $\Delta S_{gain}^{ADC}$ to gain scaler 108 to drive signal $S_{gain}^{ADC1}$ so that $\Delta S_{gain}^{ADC}$ is zero. FIG. 6 illustrates a reference ADC and one sub-ADC for simplicity and ease of discussion. However, system 180 can include more than one sub-ADC in which the gain of each sub-ADC is corrected to the gain of the reference ADC.

Figure 7:
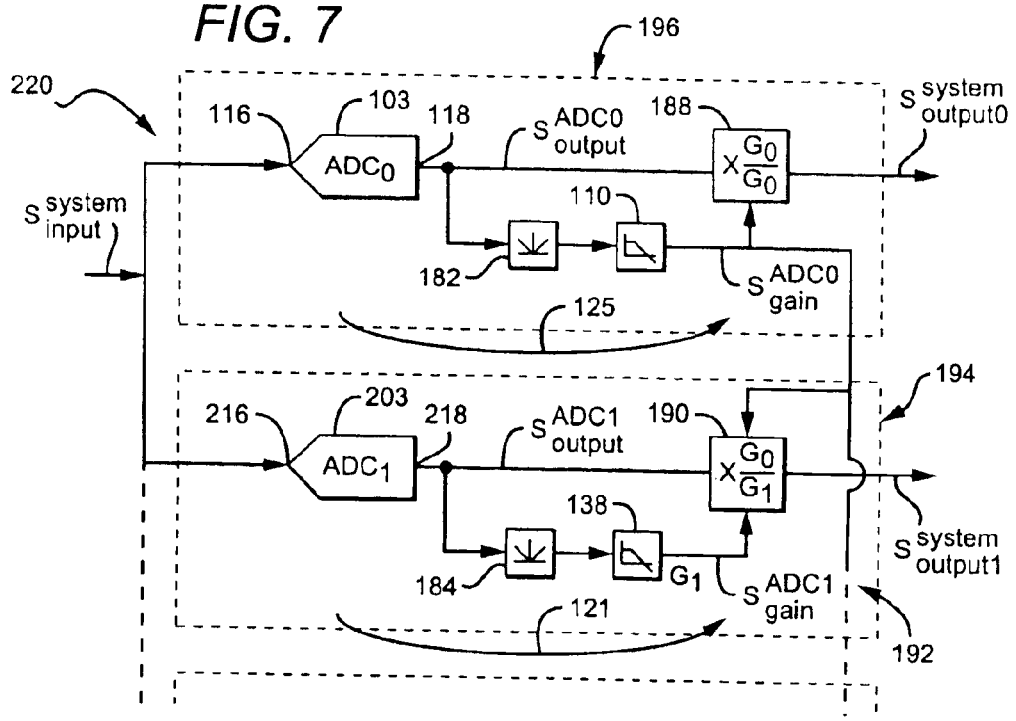
FIG. 7 is a simplified schematic diagram illustrating an interleaved signal conditioning system with a corrected gain mismatch using digital techniques.

FIG. 7 illustrates a signal conditioning system 220 which senses and corrects a gain mismatch between interleaved ADCs using digital techniques to adjust the gain mismatch. FIG. 7 illustrates a reference ADC and one sub-ADC for simplicity and ease of discussion. However, system 220 can include more than one sub-ADC in which the gain of each sub-ADC is corrected to the gain of the reference ADC.

Signal conditioning system 220 includes zero offset ADC 103 with output 118 coupled to a digital multiplier 188 in which output 118 provides output signal $S_{output}^{ADC0}$. Output 118 is also coupled to digital multiplier 188 through rectifier 182 and filter 110. Filter 110 and multiplier 188 are coupled to a digital multiplier 190. System 220 includes zero offset ADC 203 with output 218 coupled to digital multiplier 190 in which output 218 provides signal $S_{output}^{ADC1}$. Output 218 is also coupled to digital multiplier 190 through rectifier 184 and filter 138.

Zero offset ADC 203 can be similar to zero offset ADC 103 and zero offset ADCs 103 and 203 are included in this embodiment because the gain correction is typically more accurate if the offset signal between ADCs 103 and 203 has been corrected first. However, the ADCs 103 and 203 can have offset signal mismatches, but the gain correction will generally be less accurate.

Rectifier 182 and filter 110 form a feedforward loop 125 and rectifier 184 and filter 138 form feedforward loop 121 coupled between output 218 and digital multiplier 190. Feedforward loops 121 and 125 provide respective gain signals $S_{gain}^{ADC0}$ and $S_{gain}^{ADC1}$. Feedback loops can also be used, but a feedforward loop is illustrated for simplicity and ease of discussion. ADC 103, rectifier 182, digital multiplier 188, and filter 110 form a reference ADC 196 and ADC 203, rectifier 184, filter 138, and digital multiplier 190 form a gain corrected ADC 194.

In operation, zero offset ADC 103 receives system input signal $S_{input}^{system}$ at input 116, where $S_{input}^{system}$ is converted to output signal $S_{output0}^{system}$ at output 118. Gain signal $S_{gain}^{ADC0}$ is sensed by rectifying and filtering $S_{output0}^{system}$ through rectifier 182 and filter 110, respectively, where $S_{gain}^{ADC0}$ is coupled to digital multipliers 188 and 190. Similarly, zero offset ADC 203 receives $S_{input}^{system}$ at input 216 and converts $S_{input}^{system}$ to output signal $S_{output}^{ADC1}$ at output 218. Gain signal $S_{gain}^{ADC1}$ is sensed by rectifying and filtering $S_{output}^{ADC1}$ through rectifier 184 and filter 138, where signal $S_{gain}^{ADC1}$ is coupled to digital multiplier 190.

Digital multiplier 188 normalizes signal $S_{output}^{ADC0}$ to the gain of ADC 103 and digital multiplier 190 multiplies signal $S_{output}^{ADC1}$ by a ratio between $S_{gain}^{ADC0}$ and $S_{gain}^{ADC1}$ that signal $S_{output1}^{system}$ is normalized to the gain of ADC 103. Hence, the gain difference between ADCs 103 and 203 is corrected by multiplying $S_{output}^{ADC1}$ by a ratio proportional to the gain difference between ADCs 103 and 203.

Figure 8:
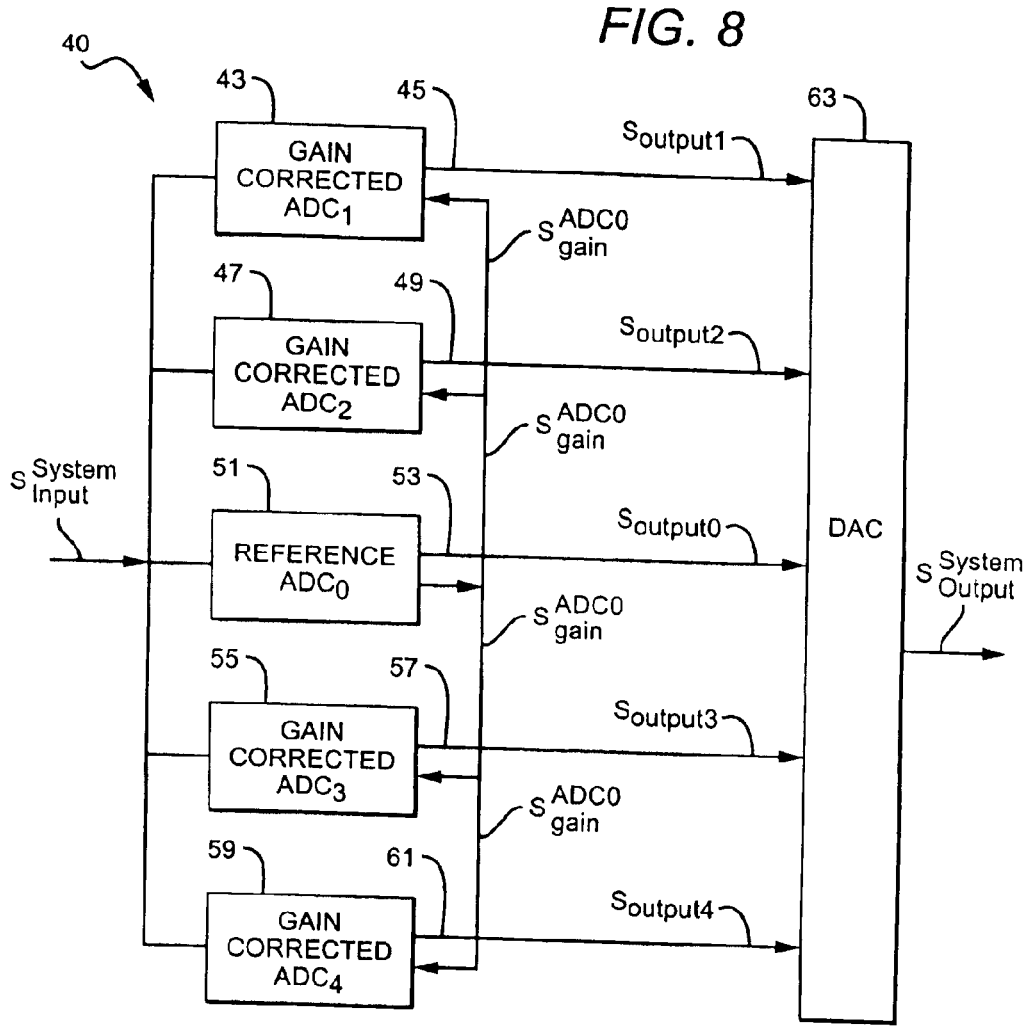
FIG. 8 is a simplified block diagram illustrating an interleaved signal conditioning system with gain corrected signals using analog techniques.

FIG. 8 illustrates a signal conditioning system 40 in which the gain mismatch is corrected by sensing a gain of a reference ADC and each sub-ADC. The difference between the gain of the reference ADC and each sub-ADC is then driven to zero using analog techniques as illustrated in FIG. 6. However, system 40 can use digital techniques as illustrated in FIG. 7 or combinations of digital and analog techniques.

Signal conditioning system 40 includes input signal $S_{input}^{system}$ coupled to inputs of interleaved ADC's 43, 47, 51, 55, and 59 which provide digital output signals $S_{output0}$, $S_{output1}$, $S_{output2}$, $S_{output3}$, and $S_{output4}$, respectively, at respective outputs 45, 49, 53, 57, and 61. Digital output signals $S_{output0}$, $S_{output1}$, $S_{output2}$, $S_{output3}$, and $S_{output4}$ are coupled to a digital-to-analog converter 63 and converted to a system output signal $S_{output}^{system}$.

The outputs of ADCs 43, 47, 51, 55, and 59 can be connected to other signal conditioning systems such as a multiplexer or a communication channel. However, the outputs of ADCs 43, 47, 51, 55, and 59 are connected to DAC 63 to better illustrate the inventive features of system 40. ADC 51 can correspond to reference ADC 196 and each of ADCs 43, 47, 55, and 59 can correspond to gain corrected ADC 194, as illustrated in FIG. 6. Five ADCs are illustrated in system 40, but it generally can include two or more ADCs. System 40 with two ADCs corresponds with system 80 or system 220 illustrated in FIGS. 6 and 7, respectively.

In operation, signal $S_{input}^{system}$ is provided to ADCs 43, 47, 51, 55, and 59. Gain signal $S_{gain}^{ADC0}$ is provided by ADC 51 to each of ADCs 43, 47, 55, and 59 so that the gain of each ADC is corrected to $S_{gain}^{ADC0}$.

Figure 9A:
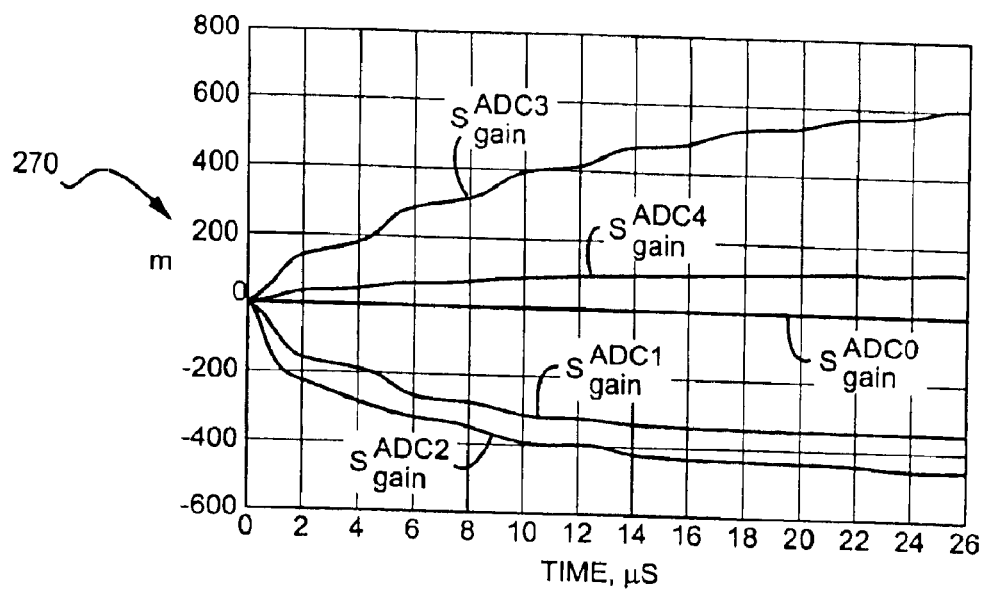
FIGS. 9a and 9b are graphs illustrating the gain mismatch correction for the signal conditioning system illustrated in FIG. 8.
Figure 9B:
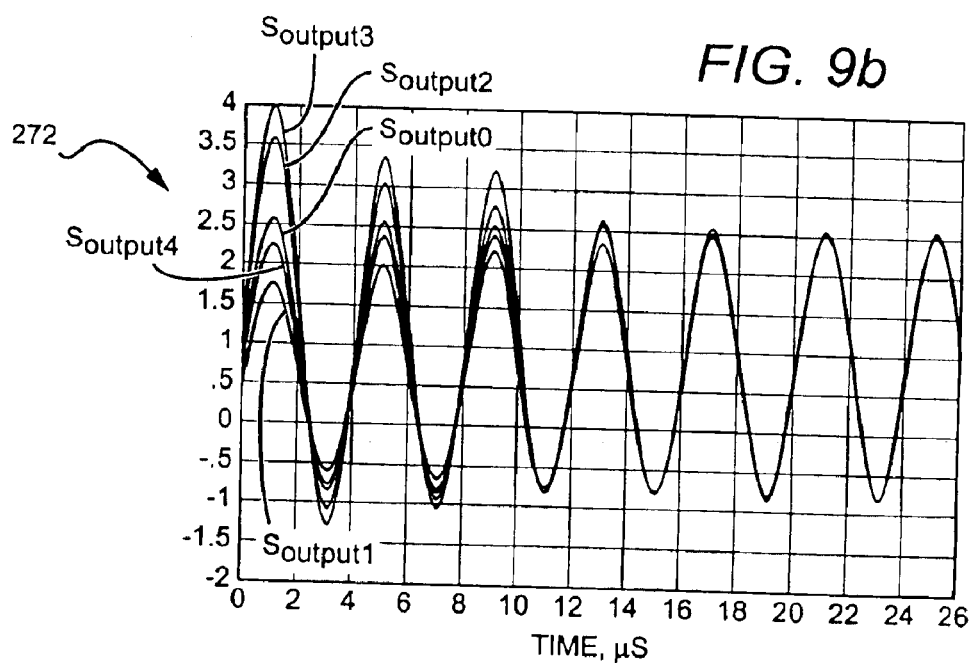

FIG. 9a illustrates a graph 270 of the gain correction signals as a function of time for the ADCs included in signal conditioning system 40 shown in FIG. 8 and FIG. 9b illustrates a graph 272 of output signal $S_{output}^{system}$ of system 40 as a function of time. The output signal shown in FIG. 9b corresponds to analog signal $S_{input}^{system}$ after $S_{input}^{system}$ has been inputted into system 40, converted to a digital signal corresponding to signals $S_{output0}$, $S_{output1}$, $S_{output2}$, $S_{output3}$, and $S_{output4}$, and then converted back into an analog signal $S_{output}^{system}$ by DAC 63.

In graph 270, signal $S_{input}^{system}$ includes a 250 kHz sine wave with a peak-to-peak voltage of 4 volts and a dc component of 1 volt. ADCs 43, 47, 51, 55, and 59 have gains of $S_{gain}^{ADC1}=0.5$, $S_{gain}^{ADC2}=1.3$, $S_{gain}^{ADC0}=0.85$, $S_{gain}^{ADC3}=1.5$, and $S_{gain}^{ADC4}=0.75$, respectively, as shown in Table 2, where the gain of ADC 51 is chosen to be the reference. In other words, the gains of ADCs 43, 47, 55, and 59 are corrected to the gain of ADC 51. The values for the gains are chosen to show how the gain mismatches are corrected by system 40.

TABLE 2

Gain correction for system 40.

| ADC | Signal | Gain | Gain Offset | Gain Correction | Corrected Gain |
|---|---|---|---|---|---|
| 143 | $S_{gain}^{ADC1}$ | 0.5 | 0.35 | −0.35 | 0.85 |
| 147 | $S_{gain}^{ADC2}$ | 1.3 | 0.45 | −0.45 | 0.85 |
| 151 | $S_{gain}^{ADC0}$ | 0.85 | 0.0 | 0.0 | 0.85 |
| 155 | $S_{gain}^{ADC3}$ | 1.5 | 0.65 | −0.65 | 0.85 |
| 159 | $S_{gain}^{ADC4}$ | 0.75 | 0.10 | −0.10 | 0.85 |

At a time equal to zero, the gain correction signals are initially zero indicating that the gain mismatches are not being corrected. At a time equal to about 26 µS, the gain correction signals converge to the the difference between the gain of reference ADC 51 and the respective gain corrected ADCs as described in conjunction with FIG. 6. Hence, when the negative of the difference is added to the gain offset, the resulting gain is equal to the reference gain (i.e. 0.85).

In FIG. 9b at time equal to zero, the distortion of signal $S_{output}^{system}$ is a maximum at time equal to zero because the offset signals are not being corrected. At time equal to about 26 µS, the distortion of signal $S_{output}^{system}$ decreases so that the distortion is minimized. The distortion decreases as the gain correction signals cancel out the corresponding gain signals so that analog signal $S_{output}^{system}$ approximates $S_{input}^{system}$.

Figure 10:
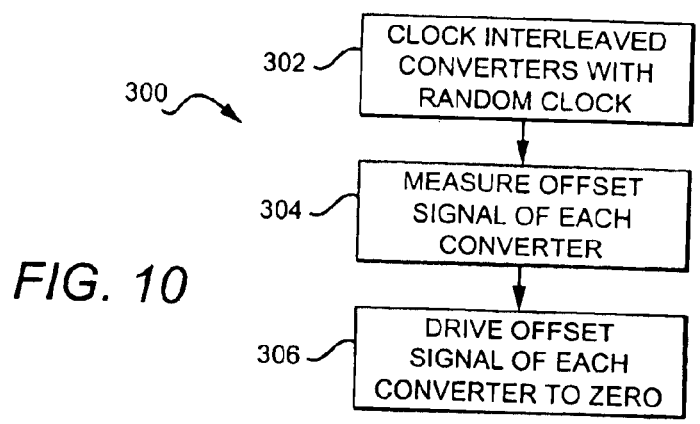
FIG. 10 is a simplified block diagram of a method of adjusting an offset signal in which the offset signal is driven to zero.

FIG. 10 illustrates a method 300 of adjusting an offset signal in a signal conditioning system in which the offset signal for each converter is driven to zero. Method 300 includes a step 302 of clocking a system of interleaved converters with a random clock signal. In a step 304, the offset signal for each converter is sensed. In a step 306, the offset signals for each converter are corrected by either a feedback loop or a feedforward loop. For the embodiment with the feedback loop, the offset signal can be subtracted from the input of the corresponding converter using analog or digital techniques. For the embodiment with the feedforward loop, the offset signal is subtracted from the output of the corresponding converter using digital techniques. Hence, the offset signal for each converter is corrected to zero.

FIG. 11 illustrates a method 310 of adjusting an offset signal in a signal conditioning system in which each offset signal is driven to a reference offset signal. Method 310 includes a step 312 of clocking a system of interleaved converters with a random clock signal in which where one converter is a reference converter. The offset can be provided by another fixed reference signal either internally or externally from the signal conditioning system. In a step 314, the offset signal for each converter is determined. In a step 316, the offset signals for each converter are corrected by either a feedback loop using analog or digital techniques or a feedforward loop using digital techniques. For both the feedback and feedforward loop embodiments, the offset of each converter is compared to the offset of the reference converter and the difference is driven to zero in a step 318. Hence, the offset signal for each converter is matched to the offset signal of the reference converter.

FIG. 12 illustrates a method 320 of adjusting a gain mismatch in a signal conditioning system using analog techniques. Method 320 includes a step 322 of clocking a system of interleaved converters with a random clock signal. One converter is a reference converter and each other converter (i.e. a sub-converter) is gain corrected to the reference converter. In a step 324, the gain or signal strengths of each sub-converter is determined using a feedback loop. In a step 326, the gain or signal strengths of the reference converter is compared to the gain of each sub-converter. In a step 328, the comparison generates feedback signals proportional to the gain difference between the reference converter and each sub-converter. In a step 330, the feedback signals are used to drive the difference between the reference converter and each corresponding sub-converter to zero.

FIG. 13 illustrates a method 340 of adjusting a gain mismatch in a signal conditioning system using digital techniques. Method 340 includes a step 342 of clocking a system of interleaved converters with a random clock signal. One converter is a reference converter and the other converters (i.e. a sub-converter) are gain corrected to the reference converter. In a step 344 the gains or signal strengths of each converter in the system of interleaved converters is determined using a feedforward loop. In a step 346, the gain or signal strength of the reference converter is compared to the gain or signal strength of each sub-converter. In a step 348, the comparison generates a feedforward signal proportional to a gain ratio between the reference converter and each sub-converter. In a step 350, the feedforward signal is used to drive the ratio between the reference converter and each sub-converter to one.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

What is claimed is:

1. A signal conditioning system, comprising:
a first converter;
a random clock, said random clock configured to decorrelate an input signal provided to said first converter from said random clock so that the average output signal of said first converter is proportional to a first offset signal; and
a first offset sensor connected to sense the first offset signal, and in response to said sensing, to condition said first converter output.

2. The system of claim 1 wherein, said random clock includes at least one of a random clock generator, a pseudorandom clock generator, and an aperiodic clock generator.

3. The system of claim 1 wherein, said random clock is configured to randomly select said first converter and to randomly sample the input signal to said first converter, at least one of the random sampling and the random selecting providing the average output of said first converter proportional to the first offset signal.

4. The system of claim 1 wherein, the first offset signal is subtracted from at least one of a first input and first output of said first converter.

5. The system of claim 1 wherein, said first offset sensor provides one of a feedback loop and a feedforward loop.

6. The system of claim 1, further including:
a second converter, said random clock being configured to decorrelate the input signal to said second converter from said random clock so that the average output signal of said second converter is proportional to a second offset signals;
a second offset sensor connected to sense the second offset signal, and in response to said sensing, to condition said second converter output.

7. The system of claim 6, further including a corrector coupled between said first and second converters, said corrector being configured to adjust the difference between the first and second offset signals.

8. The system of claim 6, further including a corrector coupled between said first and second converters, said corrector being configured to sense an offset mismatch signal between said first and second converters, the offset mismatch signal being proportional to the difference between the first and second offset signals.

9. The system of claim 6, wherein said first and second converters are selected in a random sequence correlated to a random sampling rate corresponding to said random clock.

10. An integrated circuit that converts between an analog signal and a corresponding digital code with a system sampling rate $f_s$, said circuit comprising:
a plurality of converter circuits clocked by a random clock, at least one converter circuit in said plurality of converter circuits sampling the analog signal at least every $1/f_s$ seconds; and
an offset sensing circuit configured to sense signal offsets and/or signal offset differentials between the outputs of said plurality of converter circuits.

11. The circuit of claim 10, wherein said offset sensing circuit includes a plurality of offset sensing sub-circuits, each offset sensing sub-circuit in said plurality of sub-circuits being configured to adjust the signal offset differential and/or signal offsets between respective pairs of converter circuits.

12. The circuit of claim 10, wherein the sampling is provided by a sampling circuit clocked by said random clock to decorrelate the analog input signal from a random clock signal provided by said random clock.

13. The circuit of claim 10, further including a controller circuit configured to detect instances when available converter circuits in said plurality of converter circuits are available to process an upcoming one of said random samples.

14. The circuit of claim 10, wherein said plurality of converter circuits are interleaved.

15. The circuit of claim 10, wherein said offset signal is subtracted from one of said input signal through a feedback loop circuit and said corresponding output signal through a feedforward loop circuit.

16. The circuit of claim 10, wherein each offset sensing circuit includes at least one of a filter and an amplifier.

17. The circuit of claim 10, wherein each converter circuit in said plurality of converter circuits is corrected to one of a zero offset and another desired offset value.

18. The circuit of claim 10, wherein each converter circuit in said plurality of converter circuits is corrected to said offset signal of one converter circuit in said plurality of converter circuits.

19. A method of adjusting an offset signal in a signal conditioning system, comprising:

clocking a first converter with a random clock;

sensing a first offset signal of said first converter; and conditioning one of an input signal and an output signal of said first converter with said first offset signal.

20. The method of claim 19, further including a step of sensing a second offset signal of a second converter, said second converter being clocked with said random clock.

21. The method of claim 20, further including a step of sensing a difference between said first and second offset signals.

22. The method of claim 21, further including a step of adjusting said difference between said first and second offset signals.

23. The method of claim 20, further including a step of sampling an input signal to said first and second converters with said random clock.

24. The method of claim 23, further including a step of selecting said first and second converters in a random sequence correlated to said random clock.

25. A signal conditioning system, comprising:

a first converter with a first gain and a second converter with a second gain, said first and second converters being clocked in a random sequence; and a gain corrector configured to adjust a difference between said first and second gains.

26. The system of claim 25, further including at least one of a random clock generator, a pseudorandom clock generator, and an aperiodic clock generator to provide said random sequence.

27. The system of claim 25, wherein said gain corrector provides a difference between said first and second gains.

28. The system of claim 27, wherein said difference provides a gain correction signal to adjust said gain difference between said first and second converters.

29. The system of claim 25, wherein said gain corrector provides a gain correction signal proportional to a ratio between said first and second gains.

30. The system of claim 25, wherein said gain sensor forms one of a feedback loop and a feedforward loop.

31. The system of claim 25, wherein said gain sensor includes at least one of a filter and a rectifier.

32. An integrated circuit that converts between an analog signal and a corresponding digital code at a clock rate $f_s$, said circuit comprising:

a plurality of converter circuits clocked by a random clock;

a gain sensor circuit coupled to each converter circuit in said plurality of converter circuits, said gain sensor circuit sensing a gain from said corresponding converter circuit, each gain sensor circuit being coupled to one of said plurality of converter circuits; and a controller circuit configured to select said plurality of converter circuits in a random sequence.

33. The circuit of claim 32, further including at least one sampling circuit that provides random samples of an input signal in successive $1/f_s$ clock periods, said at least one sampling circuit being clocked with a random clock signal from said random clock to decorrelate said input signal from said random clock signal.

34. The circuit of claim 33, wherein said controller circuit is further configured to detect instances when available converter circuits in said plurality of converter circuits are available to process an upcoming one of said random samples.

35. The circuit of claim 32, wherein said plurality of converter circuits are interleaved.

36. The circuit of claim 32, wherein an input signal provided to said plurality of converter circuits includes a zero-offset signal.

37. The system of claim 32, wherein said gain sensor circuit provides a gain correction signal proportional to a difference between said gain of said corresponding converter circuit and a reference gain of one other corrector circuit.

38. The system of claim 32, wherein said gain sensor circuit provides a gain correction signal proportional to a ratio between a gain of said corresponding converter circuit and a reference gain of one other corrector circuit.

39. The system of claim 32, wherein said gain sensor circuit forms one of a feedback loop and a feedforward loop.

40. The system of claim 32, wherein said gain sensor circuit includes at least one of a filter circuit and a rectifier circuit.

41. A method of adjusting a gain mismatch in a signal conditioning system, comprising:

sensing a first gain of a first converter;

sensing a second gain of a second converter, said first and second converters being clocked with a random clock; and adjusting at least one of said first and second gains to adjust said gain mismatch between said first and second converters.

42. The method of claim 41, wherein the step of adjusting at least one of said first and second gains includes a step of sensing a difference between said first and second gains.

43. The method of claim 41, wherein the step of adjusting at least one of said first and second gains includes a step of sensing a ratio between said first and second gains.

* * * * *